(12) United States Patent  
Takase

(10) Patent No.: US 7,561,608 B2
(45) Date of Patent: Jul. 14, 2009

(54) SEMICONDUCTOR LASER ELEMENT

(75) Inventor: Tadashi Takase, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/515,825

(22) Filed: Sep. 6, 2006

(65) Prior Publication Data

US 2007/0002916 A1    Jan. 4, 2007

Related U.S. Application Data

(62) Division of application No. 10/842,461, filed on May 11, 2004, now abandoned.

(30) Foreign Application Priority Data

Jun. 26, 2003    (JP) .............................. 2003-182401

(51) Int. Cl.
*H01S 5/00* (2006.01)
(52) U.S. Cl. ................. 372/45.01; 372/46.01
(58) Field of Classification Search .............. 372/45.01, 372/46.01
See application file for complete search history.

(56) References Cited

U.S. PATENT DOCUMENTS

| | | | |
|---|---|---|---|
| 5,022,036 A | 6/1991 | Suyama et al. | |
| 5,164,951 A | 11/1992 | Kagawa et al. | 372/46 |
| 5,608,752 A | 3/1997 | Goto et al. | 372/46.01 |
| 6,414,976 B1 | 7/2002 | Hirata | |
| 6,614,817 B2 | 9/2003 | Nomura et al. | 372/18 |
| 6,646,975 B1 | 11/2003 | Uchizaki et al. | 369/121 |
| 2002/0057720 A1 | 5/2002 | Nomura et al. | 372/13 |
| 2002/0159492 A1 | 10/2002 | Yamamura et al. | |
| 2002/0159493 A1 | 10/2002 | Honkawa et al. | 372/46 |
| 2002/0163949 A1* | 11/2002 | Matsumoto et al. | 372/46 |
| 2003/0057427 A1* | 3/2003 | Chida | 257/98 |
| 2004/0062285 A1 | 4/2004 | Uchizaki et al. | 372/50 |
| 2004/0264520 A1* | 12/2004 | Takase | 372/36 |

FOREIGN PATENT DOCUMENTS

JP    2-178988    7/1990

* cited by examiner

*Primary Examiner*—Hrayr A Sayadian
(74) *Attorney, Agent, or Firm*—Oblon, Spivak, McClelland, Maier & Neustadt, P.C.

(57) ABSTRACT

A semiconductor laser element including a ridge extending along a laser output direction of the laser element. The ridge has a central portion, two peripheral portions sandwiching the central portion, and two transitional portions. Window regions that are non-gain regions are located in corresponding peripheral portions. A difference in an equivalent refractive index between the central portion of the ridge and the peripheral portions on both sides is larger than a difference in an equivalent refractive index between the central portion of the ridge and transitional portions on both sides of the central portion in a gain region.

3 Claims, 13 Drawing Sheets

SEMICONDUCTOR LASER ELEMENT

This application is a divisional and claims the benefit of priority under 35 U.S.C. §120 from U.S. application Ser. No. 10/842,461, filed May 11, 2004, and claims the benefit of priority under 35 U.S.C. §119 from Japanese Patent Application No. 2003-182401, filed Jun. 26, 2003, the entire contents of each are incorporated herein by reference.

BACKGROUND OF THE INVENTION

1. Field of the Invention

The present invention relates to a semiconductor laser element, and particularly, to a semiconductor laser element used as a light source for an information recording apparatus.

2. Description of the Related Art

A recording density in an optical disk for information recording has been increasingly raised because of development in digital information technology, and a high power capability has been simultaneously required in a semiconductor laser element, which is a light source for an information recording apparatus, because of improvement on an information recording speed onto an optical disk. It is unpreferable, however, to cause nonlinearity between a current and an optical output, such as a kink, in usage of the semiconductor laser element, and it is required to provide a semiconductor laser element that has no kink in high power state, in other words with a high kink level.

In order to improve a recording speed, a semiconductor laser element is effective that has a lens system guiding light from a semiconductor laser element to an optical disk and a low aspect characteristic (a ratio of a vertical spread angle FFPy to a horizontal spread angle FFPx, FFPy/FFPx is small), with which a high optical coupling efficiency can be obtained.

In such a way, it is necessary to use a semiconductor laser element with a high kink level and a low aspect ratio in order to improve a recording density.

Japanese Non-examined Patent Publication No. 2-178988 is referred herein.

There have been available the two methods to obtain a low aspect ratio: one method in which a small FFPy is adopted and the other in which a large FFPx is adopted, whereas problems have been arisen in both methods such that a temperature characteristic is degraded with a smaller FFPy adopted, while with a larger FFPx adopted, a kink level is lowered.

Therefore, there has been conventionally difficulty in fabricating a high output laser with a low aspect.

For example, if an FFPx is made larger in order to obtain a low aspect, light in a horizontal plane is required to be confined at a higher degree, wherein with confinement of light at a higher degree, inhomogeneity in carrier injection arises due to spatial hole burning, leading to generation of a kink.

SUMMARY OF THE INVENTION

It is accordingly an object of the present invention to provide a semiconductor laser element having a structure capable of suppressing generation of a kink even in a case where an FFPx is made large.

A semiconductor laser element related to the present invention has a ridge structure in which an active layer is provided between a semiconductor layer of one conductivity type and a semiconductor layer of the other conductivity type having a ridge, and window regions that are non-gain regions are provided at both ends thereof, wherein a difference in equivalent refractive index between the ridge and portions on both sides thereof in each of the window regions is larger than a difference in equivalent refractive index between the ridge and portions on both sides thereof in a gain region.

The semiconductor laser element related to the present invention with such a construction can realize a low aspect ratio without lowering a kink level.

DESCRIPTION OF THE PREFERRED EMBODIMENTS

Description will be given of embodiments related to the present invention below with reference to the accompanying drawings.

Embodiment 1

Figure 1:
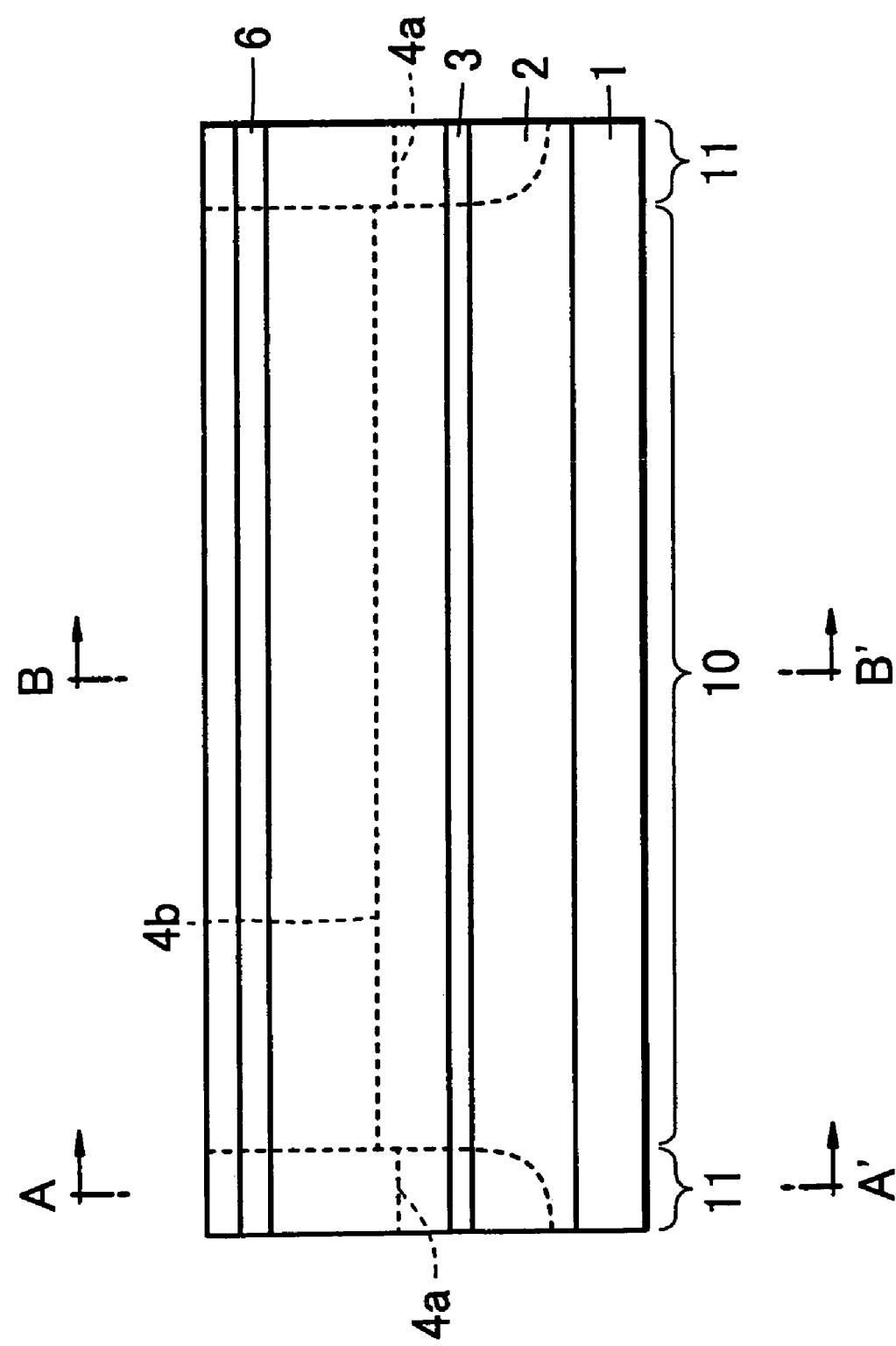
FIG. 1 is a sectional view of a semiconductor laser diode of a first embodiment related to the present invention in parallel to a resonance direction thereof.
Figure 2:
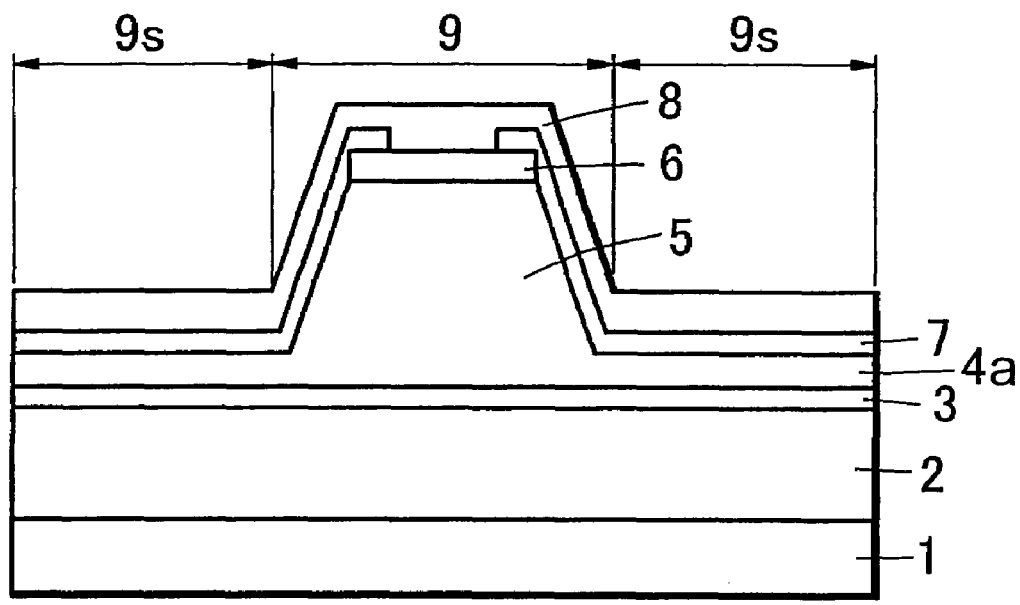
FIG. 2A is a sectional view taken on line A-A' of FIG. 1 in a window region of the semiconductor laser diode of a first embodiment and FIG. 2B is a sectional view taken on line B-B' of FIG. 1 in a gain region of the semiconductor laser diode thereof.
Figure 2:
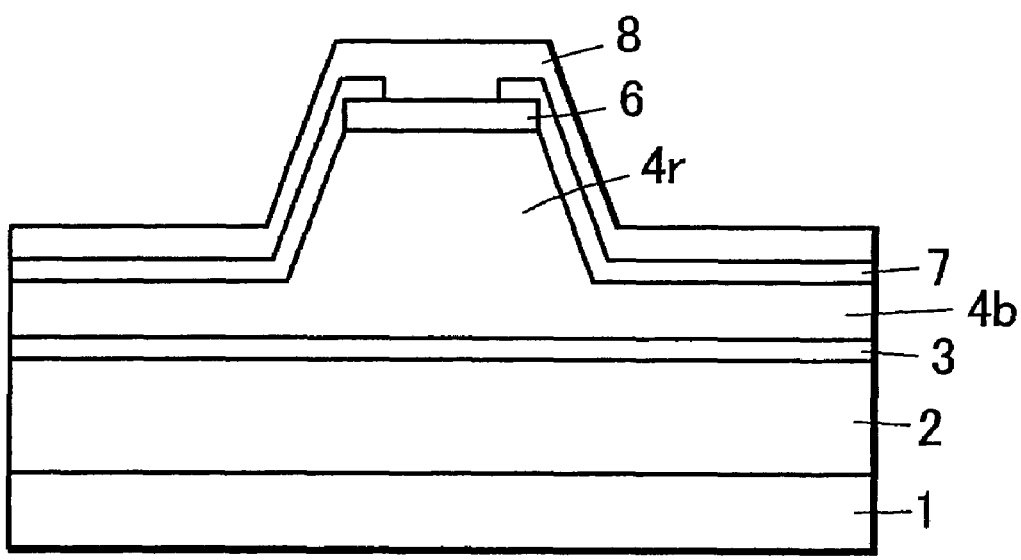

A semiconductor laser diode of the first embodiment related to the present invention is a ridge type semiconductor laser diode as shown in FIGS. 1, 2A and 2B, where FIG. 2A represents a sectional view of the semiconductor diode at line A-A' at a window region 11 in FIG. 1, and FIG. 2B represents a sectional view of the semiconductor diode at line B-B' at a gain region 10 in FIG. 1. The laser diode has a structure in which a ridge 9 is formed so that part of an upper cladding layer 4a, 4b are left behind on an active layer 3 on both sides of the ridge 9, and window regions 11, which are non-gain regions for preventing an optical damage, are formed at both ends (FIG. 1). As shown in FIGS. 1 and 2A, ridge 9 is formed by a portion 5 of the cladding layer 4a in the window region 11, and as shown in FIGS. 1 and 2B, and ridge 9 is formed by a portion 4r of the cladding layer 4b in the gain region 10. A layer 7 having an opening over a contact layer 6 that covers cladding layer 4A, 4b is shown in the sectional views of FIGS. 2A and 2B, and a layer 8 covers layer 7 and the contact layer 6 is shown in FIGS. 1, 2A, and 2B.

In the semiconductor laser diode of the first embodiment, the left upper cladding layer 4a of the window regions 11 are formed so as to be thinner than the left upper cladding layer 4b of a gain region 10.

In the semiconductor laser diode of the first embodiment with such a construction, since an equivalent refractive index difference $\Delta n11$ in the non-gain regions, each of which is a window region, can be larger than an equivalent refractive index difference $\Delta n10$ in the gain region, an FFPx can be made large, thereby enabling a low aspect to be obtained.

On the other hand, a window region 11 in which the left upper cladding layer 4a is thin in thickness in order to increase the equivalent refractive index difference $\Delta n11$ in non-gain region having no gain or a small gain; therefore, no chance to lower a kink level is encountered even with a light confinement at a great degree.

Therefore, the semiconductor laser element of the first embodiment can realize a low aspect without lowering a kink level.

Then, description will be given of a fabrication process for a semiconductor laser element of the first embodiment related to the present invention with reference to FIG. 3.

Figure 3:
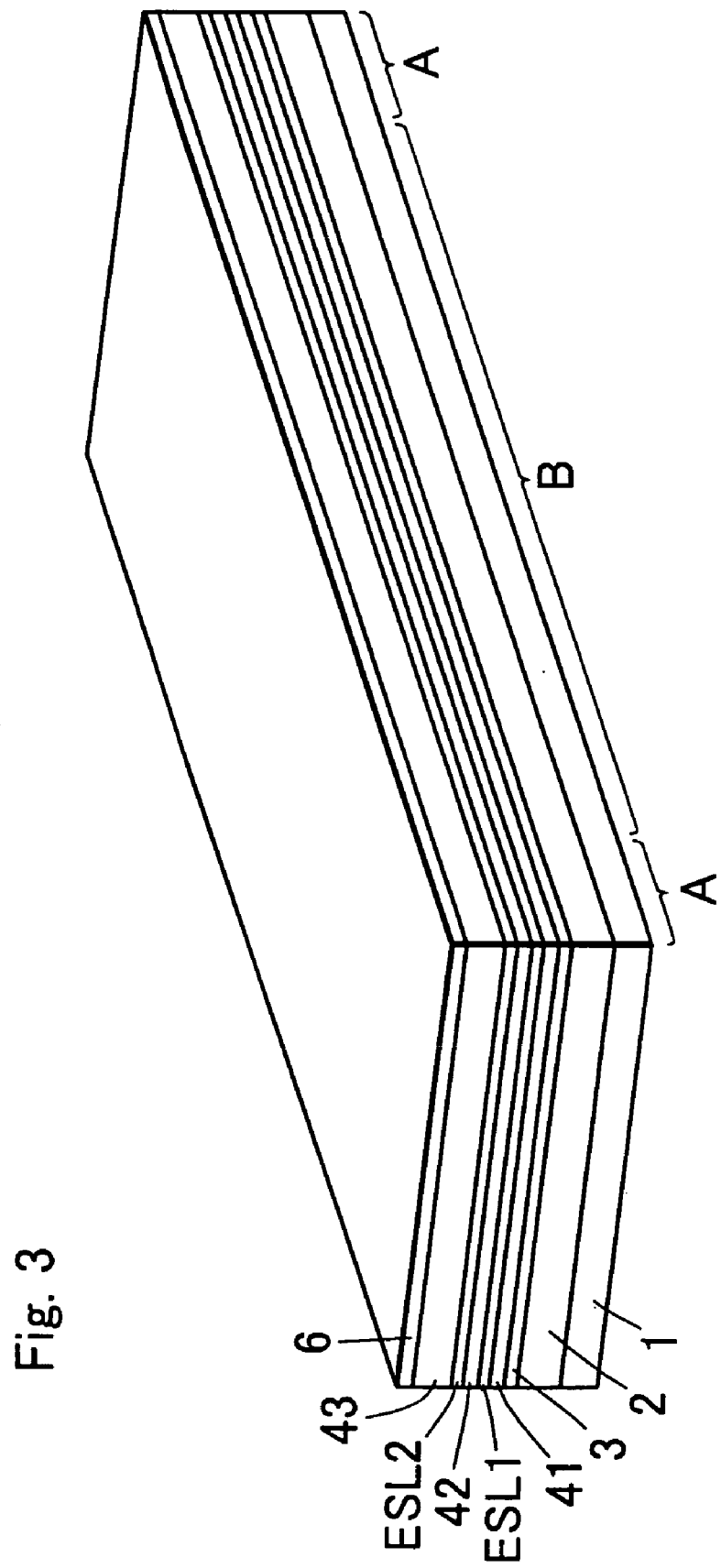
FIG. 3 is a perspective view of a semiconductor laser element in process of the first embodiment after semiconductor layers are grown in a fabrication process therefor.

In the fabrication process, epitaxially grown on a semiconductor substrate 1 are a lower cladding layer 2, a multiple quantum well active layer 3, a first left upper cladding layer 41, an etching stopper layer ESL1, a second left upper cladding layer 42, an etching stopper layer ESL2, an upper cladding layer 43 and a contact layer 6 in the order (FIG. 3).

Example materials of the substrate and the semiconductor layers are given in Table 1 in a case where a 660 nm semiconductor laser diode for DVD is constructed.

TABLE 1

| Semiconductor substrate 1 | n type GaAs substrate |
|---|---|
| Lower cladding layer 2 | n type $(Al_{0.7}Ga_{0.3})_{0.5}In_{0.49}P$ |
| Multiple quantum well active layer 3 | active layer constituted of an undoped $Ga_{0.44}In_{0.56}P$ well layer and an undoped $(Al_{0.5}Ga_{0.5})_{0.51}In_{0.49}P$ barrier layer |
| Upper cladding layer | p type $(Al_{0.7}Ga_{0.3})_{0.51}In_{0.49}P$ layer |
| Contact layer 6 | p type GaAs layer |

In Table 1, the upper cladding layer indicates the first left upper cladding layer 41, the second left upper cladding layer 42 and the upper cladding layer 43.

For example, p type $Al_{0.3}Ga_{0.7}As$ layer can be used as the etching stopper layers ESL1 and ESL2.

As another example, example materials for constituting a 780 nm semiconductor laser diode for CD are presented in Table 2.

TABLE 2

| semiconductor substrate 1 | n type GaAs substrate |
|---|---|
| lower cladding layer 2 | n type $Al_{0.48}Ga_{0.52}As$ |
| multiple quantum well active layer 3 | active layer constituted of an undoped $Al_{0.11}Ga_{0.89}As$ well layer and an undoped $Al_{0.34}Ga_{0.66}As$ barrier layer |
| upper cladding layer | p type $Al_{0.48}Ga_{0.52}As$ layer |
| contact layer 6 | p type GaAs layer |

In Table 2, the upper cladding layer indicates the first left upper cladding layer 41, the second left upper cladding layer 42 and the upper cladding layer 43.

In the constructions using the GaAs substrate shown in Tables 1 and 2, Si, proton or Zn can be used as an impurity to form the window regions 11.

The polarities of p and n types shown in Tables 1 and 2 may be reversed.

Concrete materials are exemplified in the constructions shown in Tables 1 and 2, to which the present invention is not limited.

After the epitaxial growth, an impurity is doped into portions of the regions A serving as the window regions so as to cross over the active layer by means of ion implantation, diffusion or the like. With such doping applied, the band gap of the doped active layer increases to form the window regions 11 with no absorption of light. The window regions 11 are non-gain regions with neither light absorption nor light amplification.

Note that the window regions 11 are each formed in a end portion of a width of from 5 μm to 50 μm and, more preferably, from 20 μm to 30 μm inward from an edge surface.

Figure 4:
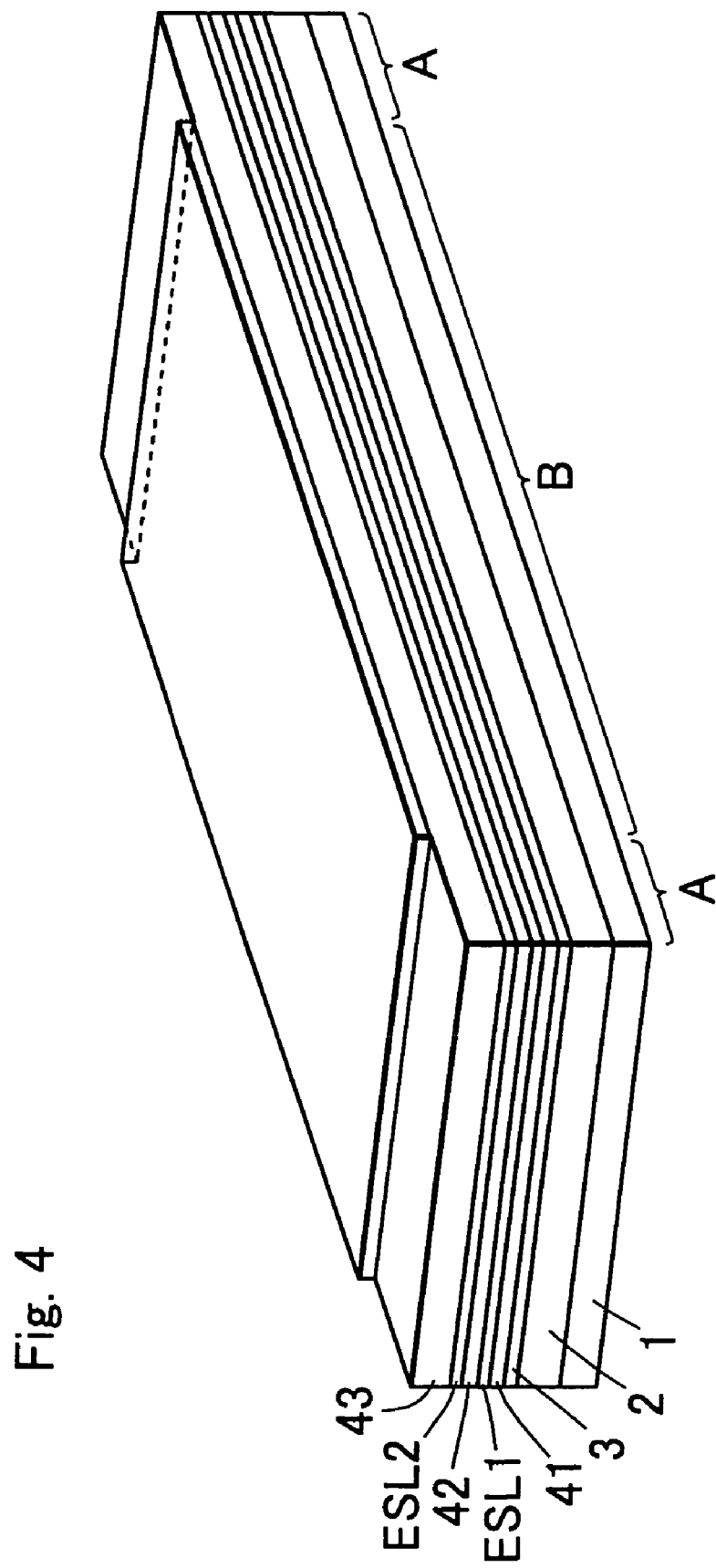
FIG. 4 is a perspective view of a semiconductor laser element in process of the first embodiment after a contact layer is etched in the fabrication process therefor.

Then, the contact layer 6 is entirely or partially etched in the regions A serving as the window regions 11 (FIG. 4).

Figure 5:
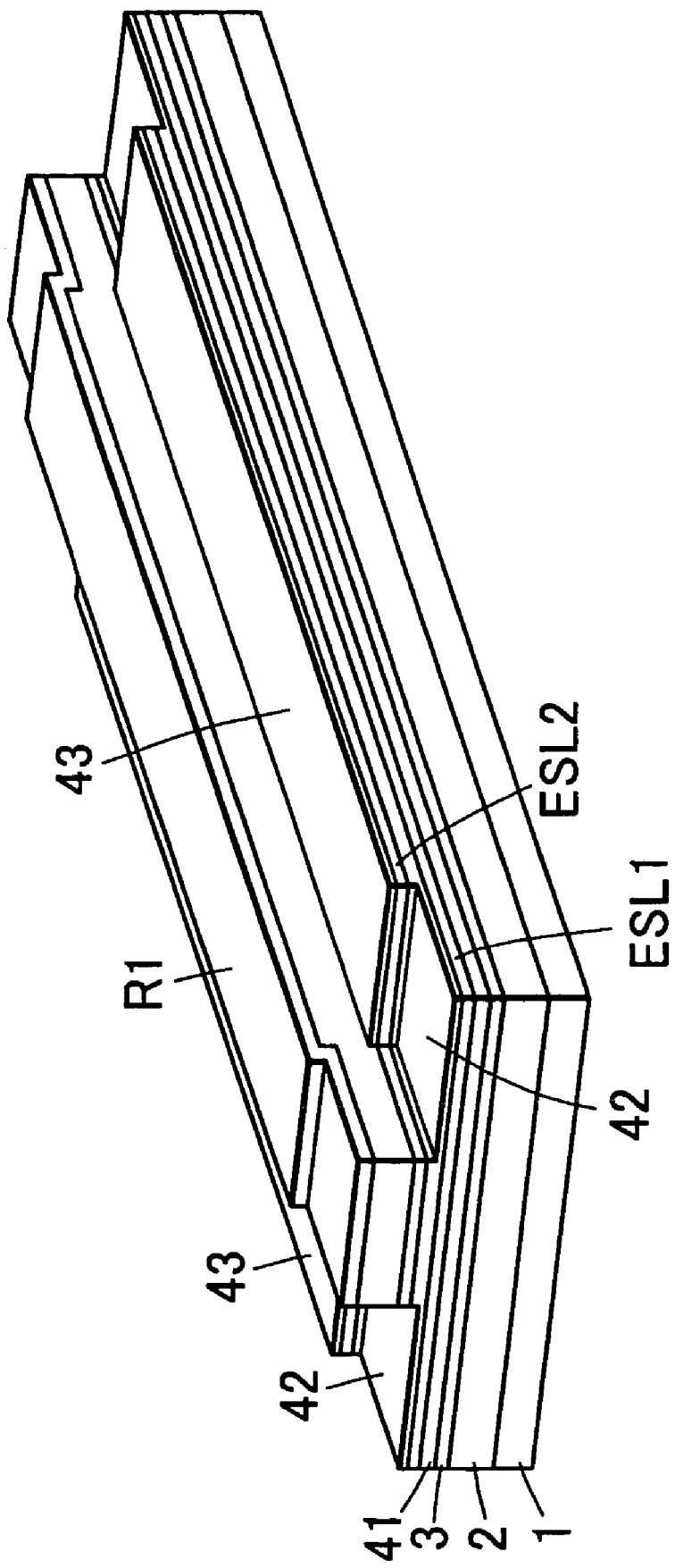
FIG. 5 is a perspective view of a semiconductor laser element in process of the first embodiment after the first etching for forming a ridge ends in the fabrication process therefor.

Thereafter, a protective film RI for providing a ridge is formed and both sides of the protective film R1 are dry etched (FIG. 5). In this step, etching conditions are set so that in the regions A, the second left cladding layer 42 is etched partway therein, while in the region B for forming the gain region, the upper cladding layer 43 is etched partway therein.

That is, in this fabrication process, a surface level difference in height between the regions A and the region B formed on both sides of the ridge is equal to a surface level difference in height between the regions A and the region B formed by etching the contact layer 6, which is described using FIG. 4.

Figure 6:
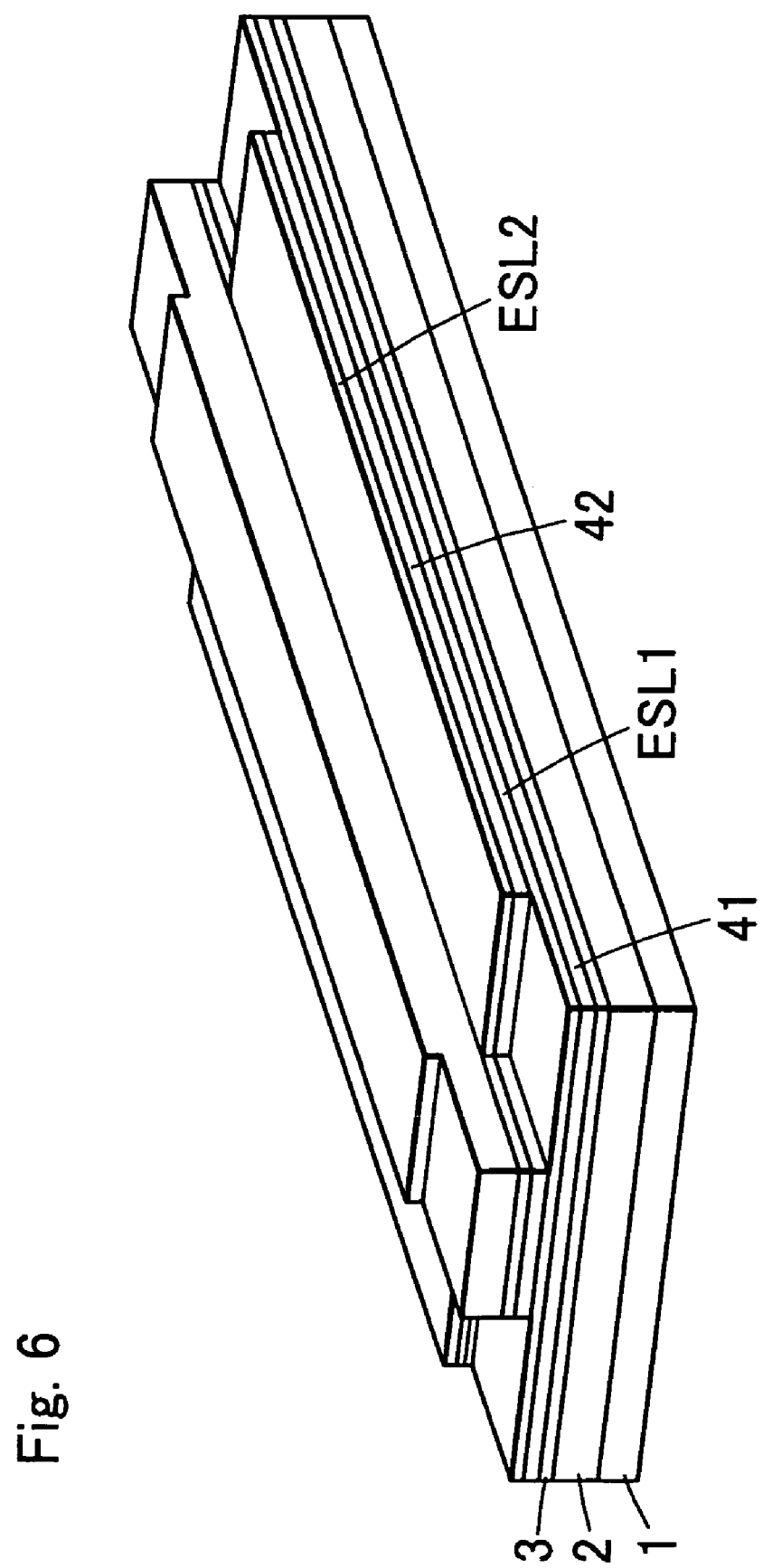
FIG. 6 is a perspective view of a semiconductor laser element in process of the first embodiment after the second etching for forming a ridge ends in the fabrication process therefor.

Then, all or some of the second left upper cladding layer 42 and all or some of the rest of the upper cladding layer 43, which are exposed, are removed by wet etching. In this wet etching, the regions A are etched off as far as the first etching stopper layer ESL1, while the region B is etched off as far as the second etching stopper layer ESL2 (FIG. 6).

In such a fabrication process, by properly setting thickness values of the first left upper cladding layer 41, the second left upper cladding layer 42 and the upper cladding layer 43, desired thickness values of the left upper cladding layer 4a in the window regions 11 and the left upper cladding layer 4b in the gain region 10 can be easily formed with good reproducibility.

Figure 7:
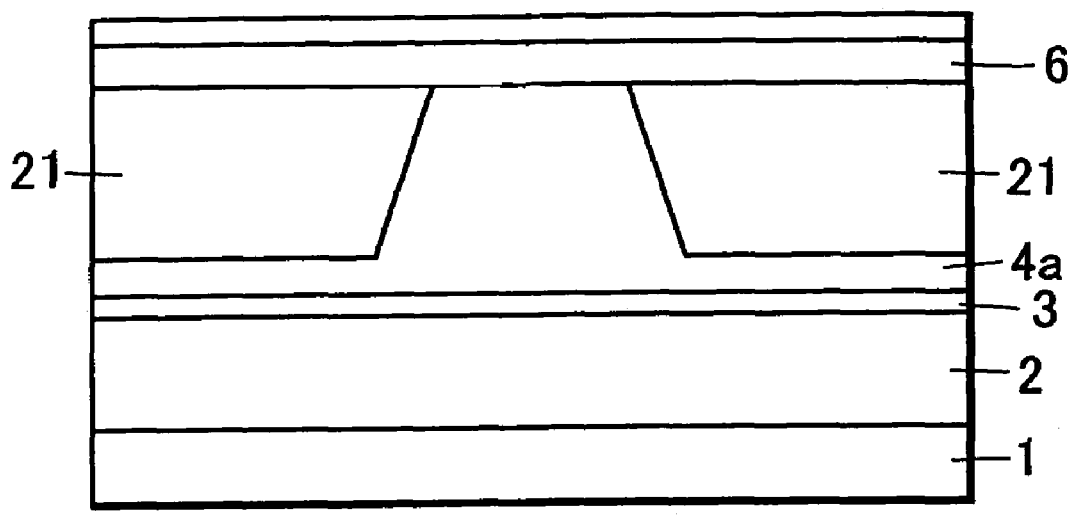
FIG. 7A is a sectional view in a window region of a semiconductor laser diode related to an example modification of the first embodiment and FIG. 7B is a sectional view in a gain region of the semiconductor laser diode related to the example modification thereof.
Figure 7:
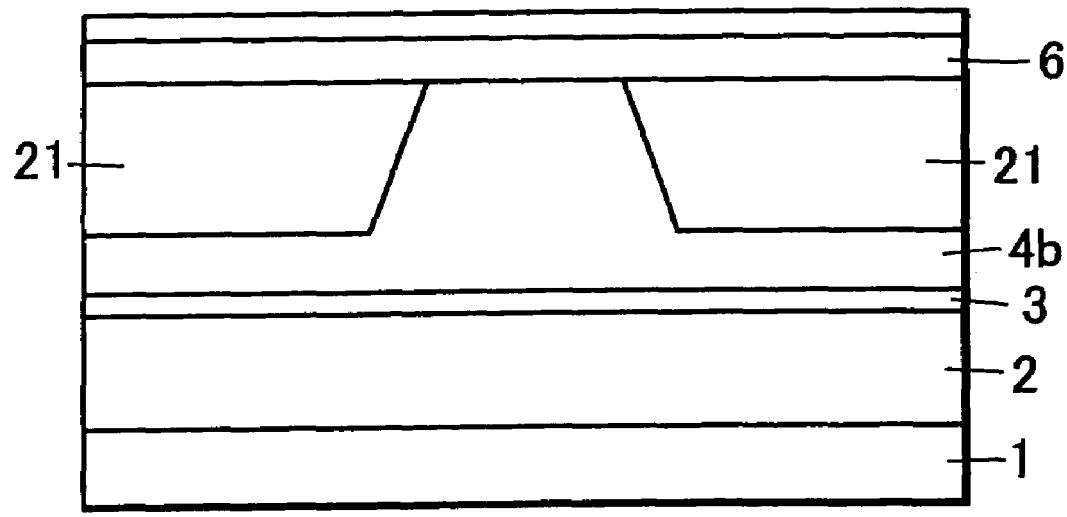

While in the semiconductor laser element of the first embodiment, description is given of a structure in which portions on both sides of the ridge 9 are neither covered with a semiconductor material nor, in other words, buried in a semiconductor material, the present invention is not limited to this construction, but can also be applied to a laser element having a structure in which the ridge 9 are, as shown in FIGS. 7A and 7B, buried in a current blocking layer 21 on both sides thereof. Note that FIG. 7A is a sectional view of a window region and FIG. 7B is a sectional view of the gain region.

Embodiment 2

Figure 8:
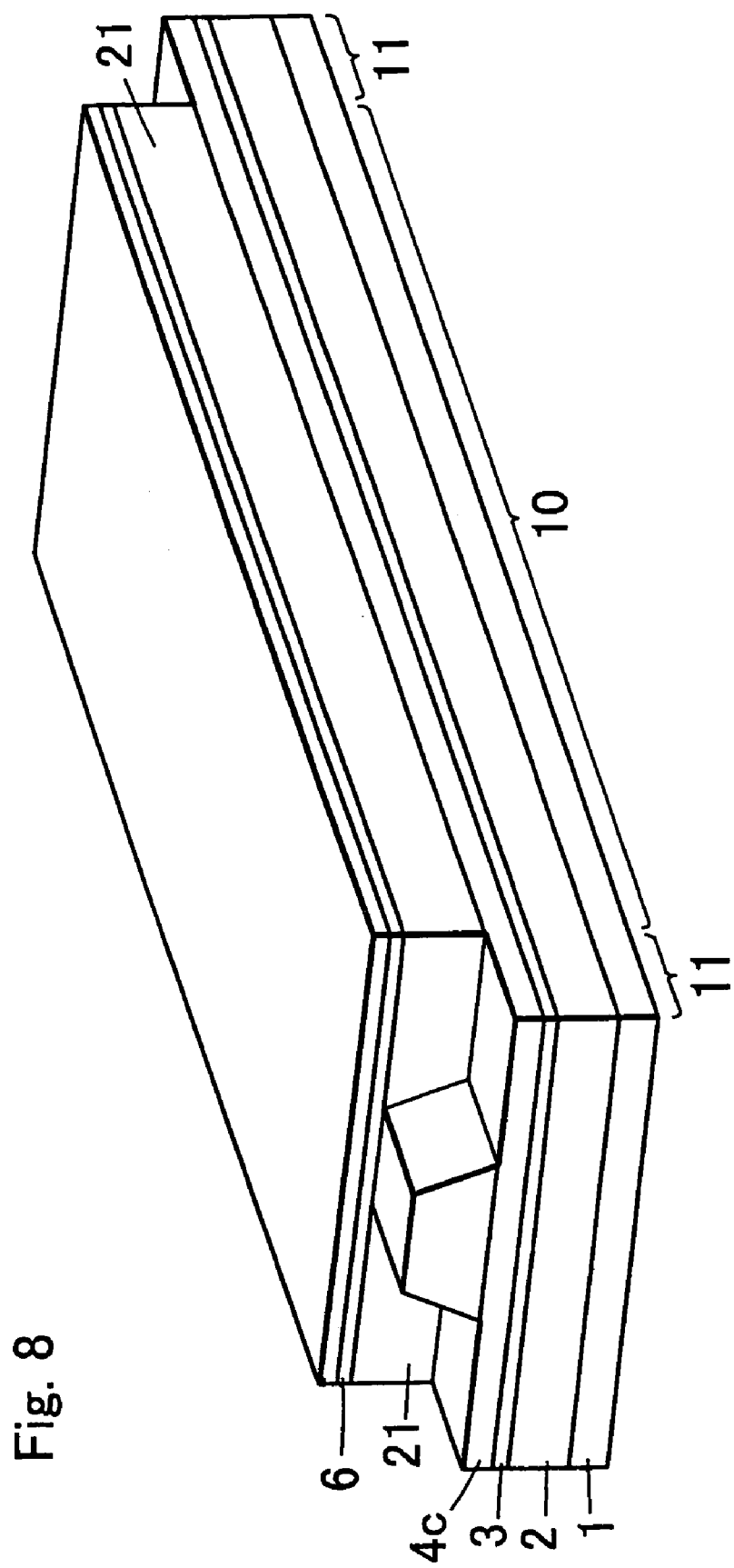
FIG. 8 is a perspective view of a semiconductor laser diode of a second embodiment.

A semiconductor laser element of the second embodiment related to the present invention is constructed in a similar manner to that in the first embodiment with the exceptions described below (FIG. 8).

Note that in FIG. 8, like symbols are attached to constituents similar to those in the first embodiment.

Distinction 1

In the semiconductor laser diode of the second embodiment, a left upper cladding layer 4c with the same thickness is formed across a gain region 10 including window regions 11 on active layer on both sides of a ridge.

Distinction 2

A current blocking layer (buried layer) 21 is formed only on both sides of the ridge in the gain region 10.

In the semiconductor laser diode of the second embodiment with such a construction as well, an equivalent refractive index difference Δn11 between the ridge and portions on both sides thereof in non-gain regions (window regions) can be larger than an equivalent refractive index difference Δn10 between the ridge and portions on both sides thereof in the gain region 10.

Therefore, in the construction of the second embodiment as well, an FFPx can be large to thereby obtain a low aspect and since the window regions larger in equivalent refractive index difference Δn11 are non-gain regions, no reduction in kink level occurs even in light confinement at a higher degree.

Accordingly, an action and effect similar to those in the first embodiment can be obtained using a semiconductor laser element of the second embodiment.

Embodiment 3

Figure 9:
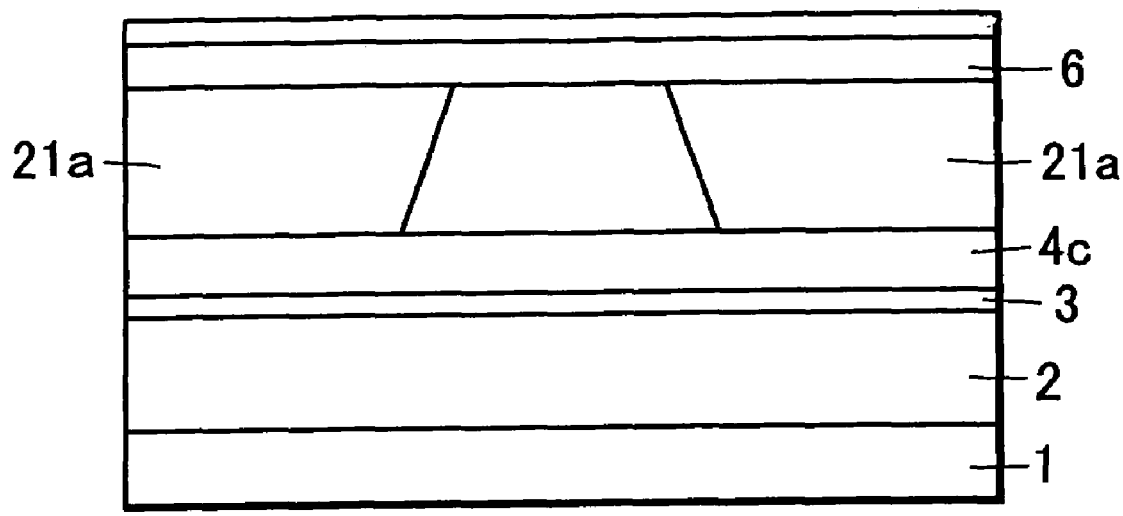
FIG. 9A is a sectional view in a window region of a semiconductor laser diode of a third embodiment and FIG. 9B is a sectional view in a gain region of the semiconductor laser diode thereof.
Figure 9:
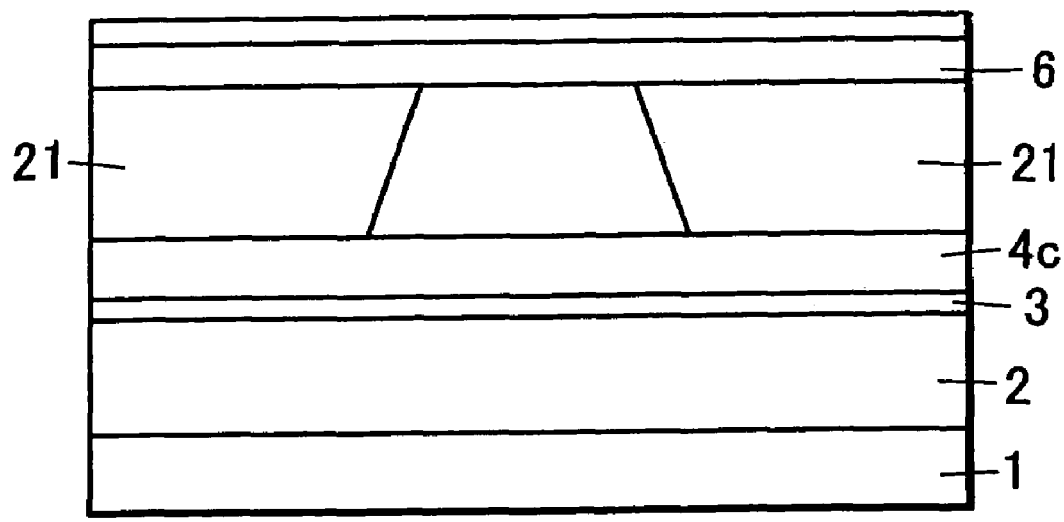

A semiconductor laser element of the third embodiment related to the present invention is constructed in a similar manner to that in the second embodiment except that formed on both sides of a ridge in window regions 11 is a buried layer 21a made of a semiconductor material having a refractive index smaller than the current blocking layer 21 formed on both sides of the ridge in a gain region 10 (FIGS. 9A and 9B).

Note that in FIGS. 9A and 9B, like symbols are attached to constituents similar to those in the first or second embodiment.

In the semiconductor laser diode of the third embodiment with such a construction, an equivalent refractive index difference Δn11 between the ridge and portions on both sides thereof in non-gain regions (window regions) can be larger than an equivalent refractive index difference Δn10 between the ridge and portions on both sides thereof in the gain region 10.

Therefore, in the construction of the third embodiment as well, an FFPx can be large to thereby obtain a low aspect and since the window regions larger in equivalent refractive index difference Δn11 are non-gain regions, no reduction in kink level occurs even in light confinement at a higher degree.

Accordingly, an action and effect similar to those in the first or second embodiment can be obtained using a semiconductor laser element of the third embodiment.

Figure 10:
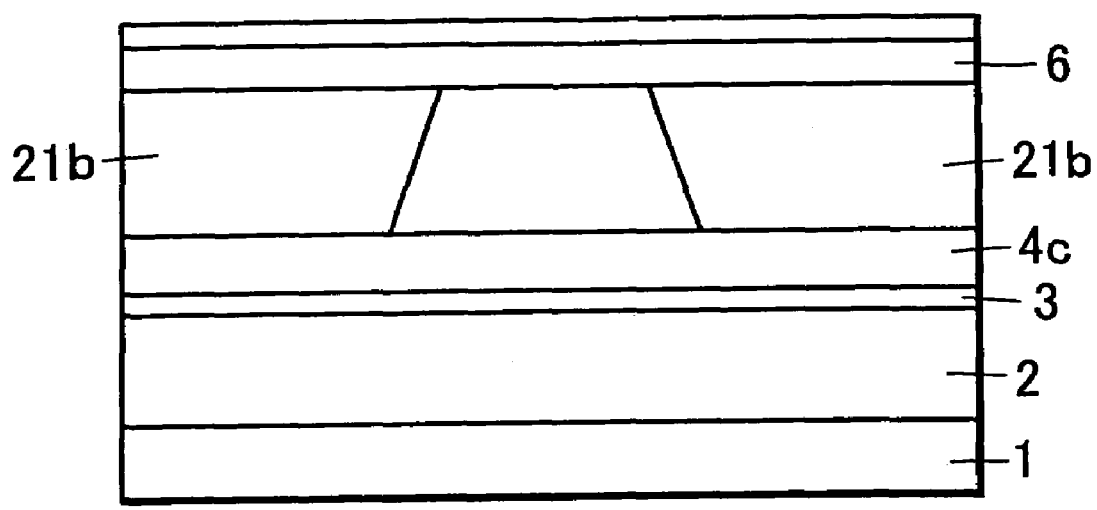
FIG. 10 is a sectional view in a window region of a semiconductor laser diode related to an example modification of the third embodiment.

While in the third embodiment described above, the buried layer 21a made of a semiconductor material having a refractive index smaller than the current blocking layer 21 is formed on both sides of the ridge in the window regions 11, another construction may be adopted in which a buried layer made of a similar semiconductor material is formed on both sides of the ridge in the window region 11 and on both sides of the ridge in the gain region 10 with the exception that a carrier concentration in the buried layer on both sides of the ridge in the window regions 11 is higher than that in the buried layer on both sides of the ridge in the gain region 10, so that the buried layer in the window regions 11 is a high carrier concentration buried layer 21b (FIG. 10).

With such a construction adopted, a refractive index of the high carrier concentration buried layer 21b can be rendered small due to a plasma effect, thereby enabling an action and effect similar to those in the third embodiment to be obtained.

Embodiment 4

A semiconductor laser element of the fourth embodiment related to the present invention is constructed such that current blocking layer 21c is formed using a material absorbing laser oscillated light, for example GaAs on both sides of a ridge in window regions 11.

Figure 11:
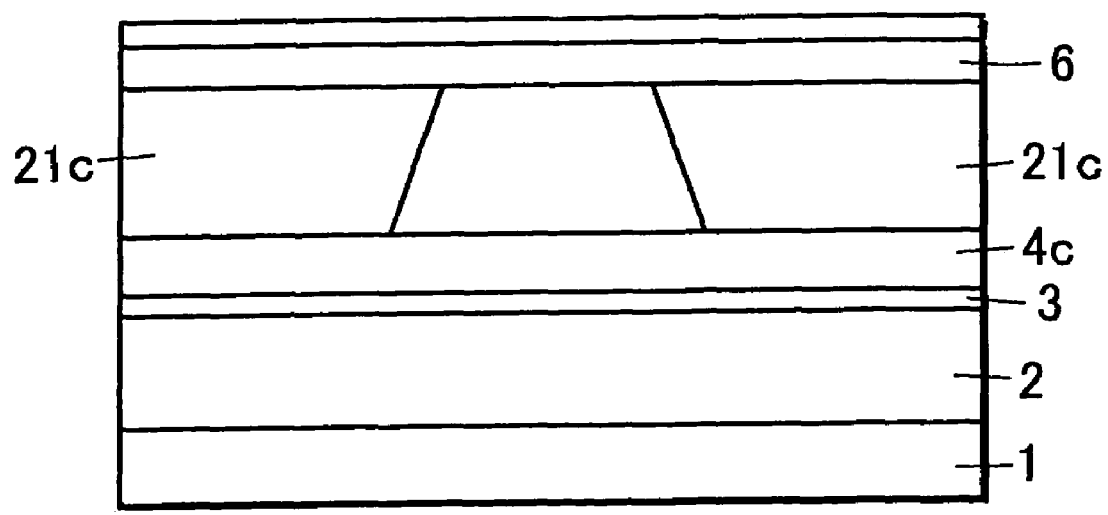
FIG. 11 is a sectional view in a window region of a semiconductor laser diode of a fourth embodiment.

Note that a construction of a gain region 10 may be similar to that in the first embodiment or in the second embodiment (in FIG. 11, the construction is depicted as being similar to that in the second embodiment).

In the semiconductor laser element of the fourth embodiment with such a construction, light is absorbed by the current blocking layer 21c, thereby enabling a spot size in a horizontal plane at an end surface thereof to be reduced.

With a smaller spot size in a horizontal plane, a far field pattern (FFPx) in a horizontal plane can be enlarged due to a diffraction phenomenon of light, thereby enabling a low aspect to be realized without lowering a kink level.

Embodiment 5

The fifth embodiment related to the present invention is a process in which the left upper cladding layer 4a in the window regions 11 is formed to be thinner than the left upper cladding layer 4b in the gain region 10, which is different from the process described in the first embodiment.

To be concrete, this fabrication process is different from the process described in the first embodiment in that the etching stopper layer ESL2 is a multiple quantum well structure and no etching stopper layer ESL1 is formed. That is, in this process, the first left upper cladding layer 41 and the second left upper cladding layer 42 are formed continuously with the same material.

Herein, the etching stopper layer ESL2 of a multiple quantum well structure can be a multiple quantum well structure constructed of a $Ga_{0.58}In_{0.42}P$ well layer and an $(Al_{0.5}Ga_{0.5})_{0.51}In_{0.49}P$ barrier layer.

Then, an impurity is, in a similar manner to that in the first embodiment, doped in the regions A used for forming window regions by means of ion implantation, diffusion or the like. With the doping, the etching stopper layer ESL2 of a multiple quantum well structure in the window regions are degenerated into disorder and loses an etching stopper function.

After such a processing, etching is conducted for forming the ridge, whereby in the window regions, etching progresses beyond the etching stopper layer ESL2, while in the gain region, etching is stopped by the etching stopper layer ESL2.

After the step, a thickness of the left upper cladding layer 4a in the window regions 11 can be thinner than that of the left upper cladding layer 4b in the gain region 10 with ease.

Embodiment 6

The sixth embodiment related to the present invention is a fabrication process fabricating an element having a structure shown in the first embodiment without forming an etching stopper layer.

Figure 12:
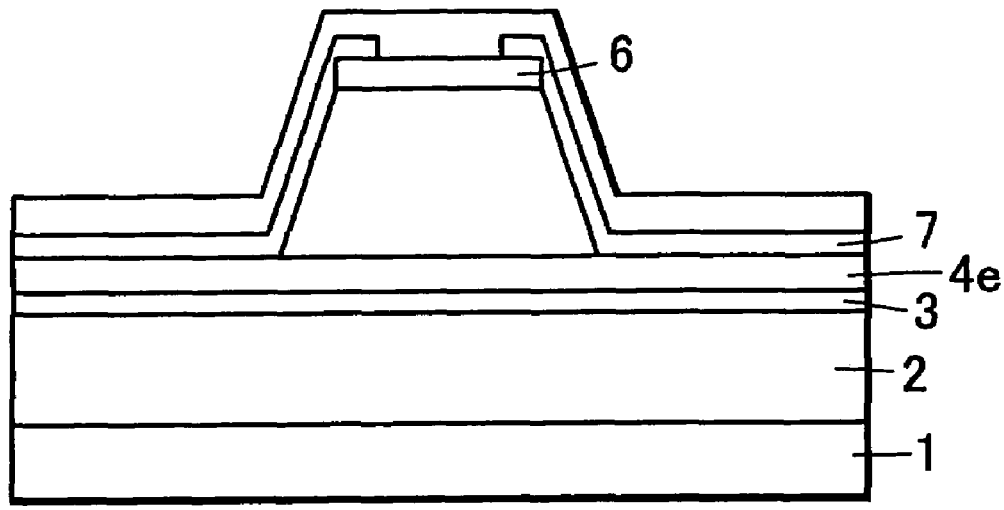
FIG. 12A is a sectional view in a window region of a semiconductor laser diode of a sixth embodiment and FIG. 12B is a sectional view in a gain region of the semiconductor laser diode thereof.
Figure 12:
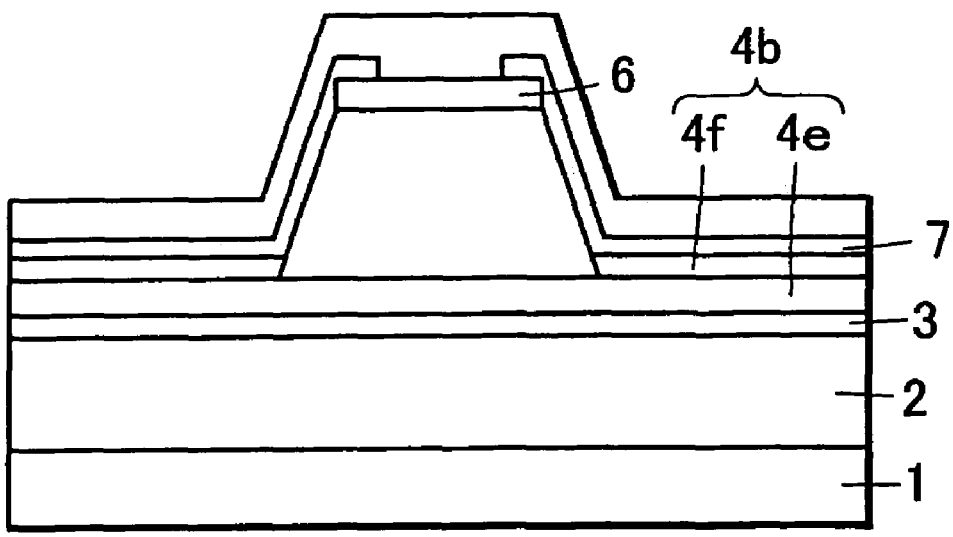

To be concrete, in the sixth embodiment, a left upper cladding layer 4e with the same thickness is formed across the gain region 10 including the window regions 11 on both sides of the ridge 9 in etching to form the ridge 9. A mask for selective growth is formed on the window regions to selectively grow a left upper cladding layer 4f on both sides of the ridge in the gain region 10 (FIGS. 12A and 12B).

In such a way, a thickness of the left upper cladding layer 4b in the gain region 10 can be formed to be thicker by a thickness of the left upper cladding layer 4f selectively grown.

According to a fabrication process of the sixth embodiment, a semiconductor laser element having a structure of the first embodiment with ease.

Embodiment 7

The seventh embodiment related to the present invention is a process in which the lift upper cladding layer 4a in the window regions 11 is formed to be thinner than the left upper cladding layer 4b in the gain region 10, which is different from the process described in the first, fifth or sixth embodiment.

Figure 13:
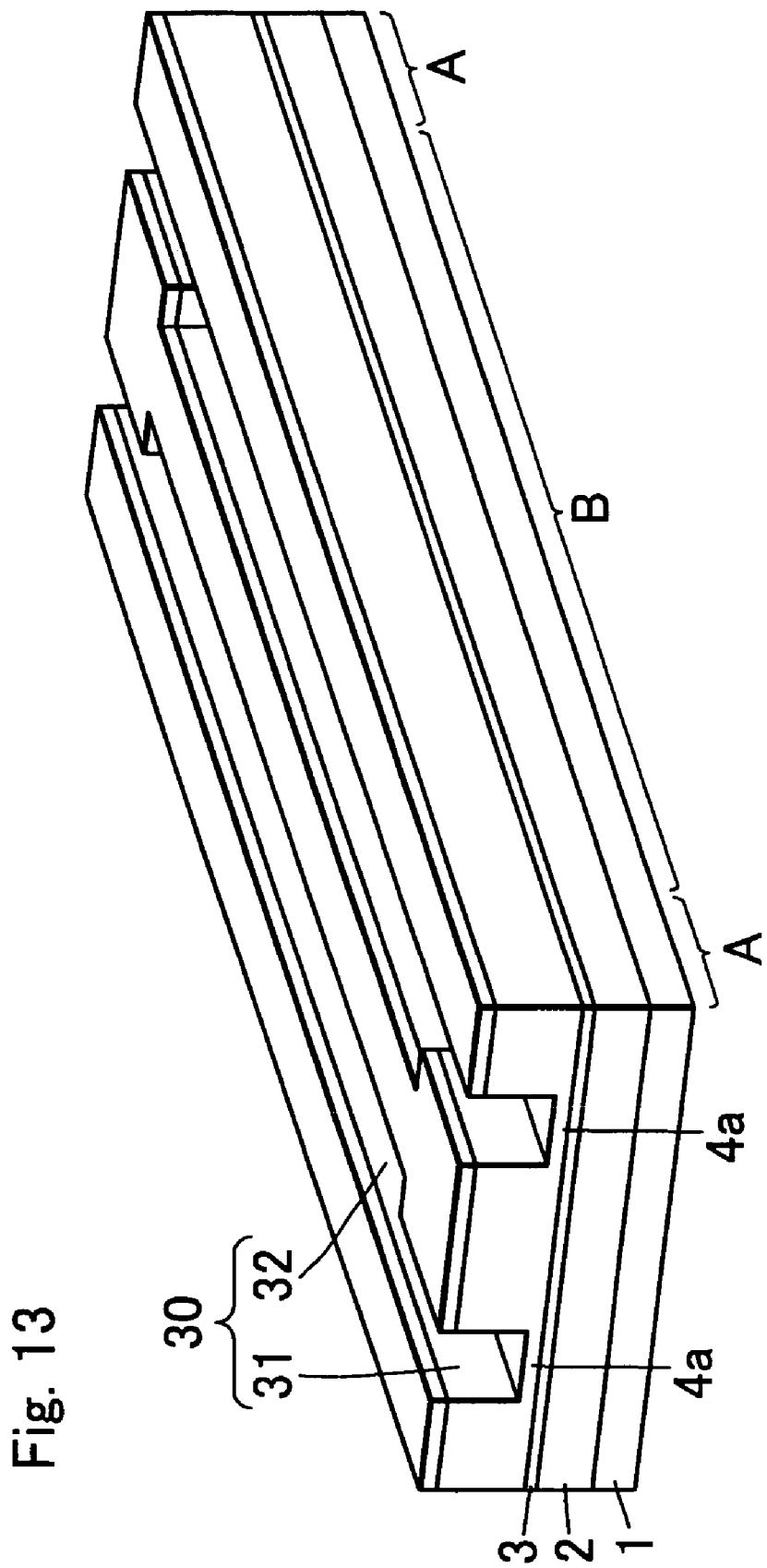
FIG. 13 is a sectional view of a semiconductor laser diode of a seventh embodiment related to the present invention in parallel to a resonance direction thereof.
Figure 14:
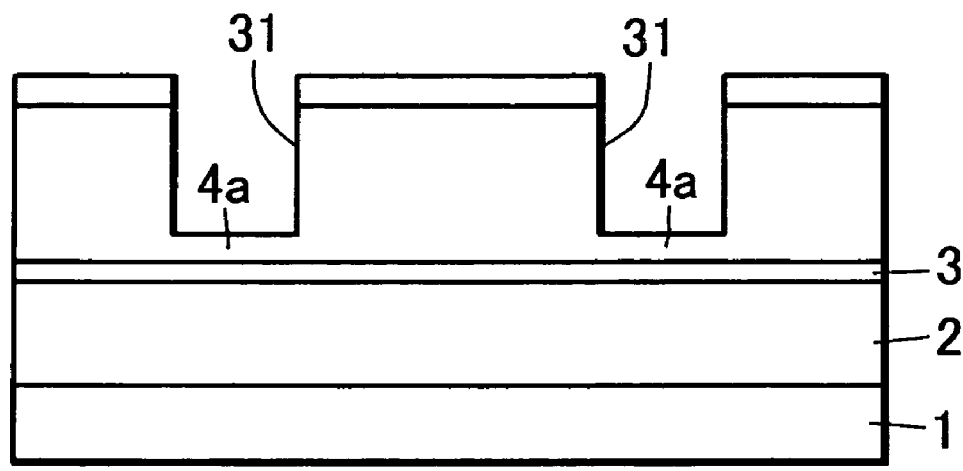
FIG. 14A is a sectional view in a window region of the semiconductor laser diode of a seventh embodiment and FIG. 14B is a sectional view in a gain region of the semiconductor laser diode thereof.
Figure 14:
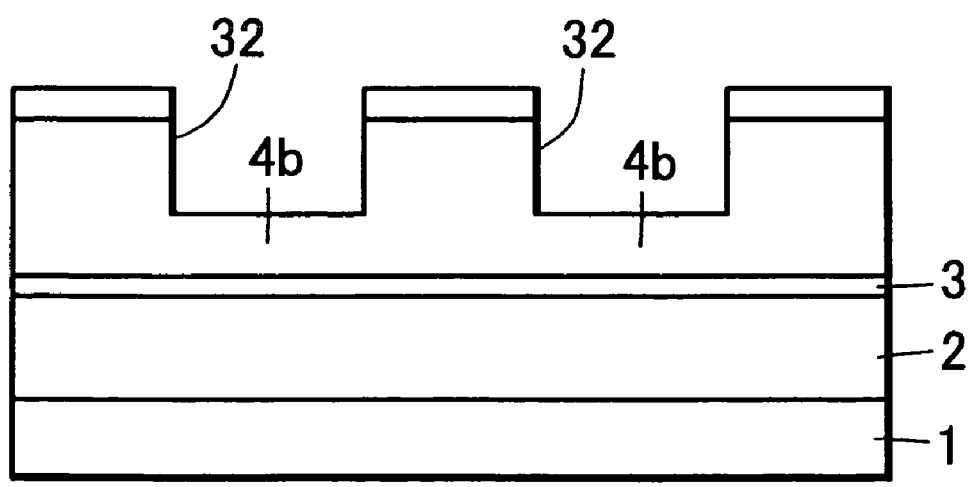

The fabrication process is, to be concrete, a process fabricating a semiconductor laser element in which two grooves 30 parallel to each other are formed and a narrow region between the two grooves 30 serves as a ridge, wherein width values of a groove 30 in the regions A serving as the window regions is different from a width value of the groove 30 in the region B serving as the gain region, whereby the left upper cladding layer 4a in the window regions 11 is formed to be thinner than the left upper cladding layer 4b in the gain region 10 (FIG. 13 and FIGS. 14A and 14B).

That is, in the process, portions on both sides of the ridge are etched so that a width of each of the grooves 31 of a region A for forming a window is narrower than a width of each of the grooves 32 forming the gain region.

To be more concrete, an etching resist film is formed on the contact layer, and formed at both sides of a ridge are openings having widths thereof wider in first regions corresponding to edges of a semiconductor laser element and narrower in the other region thereof.

Then, the contact layer and the upper cladding layer are etched through openings of a mask to remove a stock down to a predetermined depth.

In the etching through the mask, since in a portion of a groove 31 narrower in width (etching region), a supply speed for an etching agent is faster than in a portion of the groove wider in width, etching progresses faster in the portion of a groove 31. Thereby, the left upper cladding layer 4a in a window region 11 can be easily thinner than the left upper cladding layer 4b in the gain region.

As described above, in a fabrication process of the seventh embodiment as well, it is possible to fabricate a low aspect semiconductor laser diode with a high kink level.

As detailed above, in a semiconductor laser element related to the present invention, since an equivalent refractive index difference between the ridge and portions on both sides thereof in the window regions is made larger than an equivalent refractive index difference between the ridge and portions on both sides thereof in the gain region, a low aspect can be acquired without lowering a kink level.

What is claimed is:

1. An edge emitting semiconductor laser element comprising:
   a first semiconductor layer of one conductivity type;
   a second semiconductor layer of the other conductivity type having a ridge extending in an axial direction;
   an active layer provided between said first semiconductor layer and said second semiconductor layer;
   window regions of a finite thickness in the axial direction, one of the window regions including one of the end portions of the active layer, another one of the window regions including an other end portion of the active layer, the window regions having been doped with impurities and forming a non-gain region; and
   buried layers, configured to block current, disposed on side faces of said ridge extending between a top face and a bottom face of said ridge, except at a whole location of the window regions of the finite thickness,
   wherein the concentration of impurities doped in the window regions prevents absorption of light emitted by the semiconductor laser element by the window regions.

2. The semiconductor laser element according to claim 1, wherein the finite thickness of the window regions is between 5 μm to 50 μm.

3. The semiconductor laser element according to claim 1, wherein the finite thickness of the window regions is between 20 μm to 30 μm.

* * * * *